United States Patent
Keaveney

(10) Patent No.: US 7,317,360 B2
(45) Date of Patent: Jan. 8, 2008

(54) FRACTIONAL-N SYNTHESIZER SYSTEM AND METHOD

(75) Inventor: Michael F. Keaveney, Lisnagry (IE)

(73) Assignee: Analog Devices, Inc., Norwood, MA (US)

( * ) Notice: Subject to any disclaimer, the term of this patent is extended or adjusted under 35 U.S.C. 154(b) by 92 days.

(21) Appl. No.: 11/407,646

(22) Filed: Apr. 20, 2006

(65) Prior Publication Data
US 2007/0247233 A1    Oct. 25, 2007

(51) Int. Cl.
*H03L 7/00* (2006.01)

(52) U.S. Cl. .............. 331/16; 331/18; 331/2; 331/34; 375/376

(58) Field of Classification Search .......... 331/16, 331/34, 2, 18; 375/376
See application file for complete search history.

(56) References Cited

U.S. PATENT DOCUMENTS 6,556,086 B2    4/2003    Keaveney et al.

2003/0020550 A1*    1/2003    Nelson et al. ............ 331/14
2004/0264622 A1*    12/2004    Walsh et al. ............ 375/376

* cited by examiner

*Primary Examiner*—Arnold Kinkead
(74) *Attorney, Agent, or Firm*—Iandiorio & Teska

(57) ABSTRACT

A fractional-N synthesizer system including a plurality of fractional-N synthesizers all updated to simultaneously generate an output frequency from the same reference frequency, a phase locked loop having an output signal whose frequency is a fractional multiple of the input reference frequency; the phase locked loop including a frequency divider, an interpolator responsive to an input fraction to provide to the frequency divider an output which has a fractional value equal to on average, the input fraction; and a timeout circuit responsive to the reference frequency for generating an output a predetermined time after updating to initialize the interpolator in each synthesizer to the same start conditions for locking together the phase of the frequency outputs of all of the synthesizers at the updated frequency.

8 Claims, 4 Drawing Sheets

FRACTIONAL-N SYNTHESIZER SYSTEM AND METHOD

FIELD OF THE INVENTION

This invention relates to a fractional-N synthesizer system and method for synchronizing the output phase and frequency of a plurality of fractional-N synthesizers.

BACKGROUND OF THE INVENTION

In a phase locked loop (PLL) the output signal is phase and frequency locked to an input reference signal. A PLL with a frequency divider inserted in the feedback loop can be used to make an Integer-N frequency synthesizer. In that case the signal at the phase detector negative input is phase and frequency locked to the reference. The output frequency and phase is N times the reference frequency and phase. Output frequencies can be synthesized in steps of the reference frequency by programming the value of N. There are exactly N periods of the output for every period of the reference and therefore one rising edge of the output in every N is in phase with each rising edge of the reference. For any given value of N the phase of the output relative to the reference is fixed and is the same each time the synthesiser is switched back to that frequency channel. In a fractional-N synthesiser, the divider in the feedback path has an integer and fractional part and the output frequency step resolution is a fraction of the reference frequency, as shown in equation (1):

$$f_{OUT} = \left(N + \frac{F}{M}\right) \times f_{REF} \quad (1)$$

The fractional part is generated using a digital interpolator. This outputs a sequence of integer values with an average value given by F/M where F is the input fraction and M is the modulus. The modulus M can be programmable also or it may be fixed for a given implementation.

The interpolator could be for instance, a single accumulator with the overflow bit as output or it could be a higher order sigma-delta modulator. There are numerous prior art examples of both architectures.

Fractional-N synthesizers have a number of advantages which make them desirable. Their output steps are in fractions of the reference frequency. This allows the use of larger input reference frequencies which in turn allows N to be smaller. This is a major advantage because phase noise gain from input to output is a function of $N^2$ or 20 Log N in dB's so the noise can be much reduced by even a small reduction in N. Also the availability of a larger reference frequency allows a wider loop bandwidth which in turn allows a shorter settling time each time the synthesizer is switched from one frequency channel to another.

By rewriting equation (1) as follows:

$$f_{OUT} = (MN + F) \times \frac{f_{REF}}{M} \quad (2)$$

it is clear that the output will only be in phase with one out of every M edges of the input reference. This highlights a major disadvantage of fractional-N synthesizers in that the output phase can have any one of M possible values with respect to the input reference phase, where M is the fractional modulus. Which one of the M edges of the reference this will be may be different each time the channel is synthesized depending on the particular state of the interpolator when the new N and F values, which specify the channel to be synthesized, are loaded. In some applications this doesn't matter but when it is required that a particular output frequency signal has consistently the same phase relationship with a reference then this is a problem with a fractional-N synthesizer.

This problem has been addressed in U.S. Pat. No. 6,556,086. In that approach synchronization pulses are provided every K cycles with respect to $f_{ref}$ where K is a multiple of M. A disadvantage of this implementation is that if M is very large then the time interval between synchronization pulses will be long. For example, if M is chosen to provide 1 Hz output resolution then the time interval between synchronization pulses will be 1 second. This is a problem in applications that require a shorter settling time to final phase. Another disadvantage is that it requires divide-by-K synchronization counter to be continuously clocked by the reference. As well as in increased power consumption, the switching noise due to this activity may degrade the synthesizers phase noise performance or cause spurious sidebands at offsets of $+/-f_{ref}/K$ around the synthesizer output carrier frequency. In some applications, where a plurality of fractional-N synthesizers are driven from a common reference frequency, it is only required that the outputs of the synthesizers have a consistent phase relationship with each other, not necessarily with the input reference. This reduced requirement allows an alternative structure that avoids the listed disadvantages of the implementation of U.S. Pat. No. 6,556,086.

SUMMARY OF THE INVENTION

It is therefore an object of this invention to provide an improved fractional-N synthesizer system and method for synchronizing the output phase and frequency of a plurality of fractional-N synthesizers.

It is a further object of this invention to provide such an improved fractional-N synthesizer system and method for synchronizing the output phase and frequency of a plurality of fractional-N synthesizers where M can be as large as desired as the synchronization time need not be a function of M.

It is a further object of this invention to provide such an improved fractional-N synthesizer system and method for synchronizing the output phase and frequency of a plurality of fractional-N synthesizers where the synchronization time can be small resulting in less hardware, less area and less cost and in shorter synchronizing time.

It is a further object of this invention to provide such an improved fractional-N synthesizer system and method for synchronizing the output phase and frequency of a plurality of fractional-N synthesizers where the synchronization timer need not run continuously requiring less power and resulting in less noise.

The invention results from the realization that in fractional-N synthesizer systems including a plurality of fractional-N synthesizers all of which simultaneously generate the same output frequency from a reference frequency and are periodically updated to other output frequencies and need only be phase and frequency synchronized to each other and not necessarily to the reference frequency a faster, less expensive, less noisy synchronization can be effected by updating each of the fractional-N synthesizers to generate simultaneously the same output frequency from the same reference frequency and generating an output a predetermined time after updating the frequency to initialize the interpolator in each synthesizer to the same start condition for locking together the phase of the frequency outputs of all of the synthesizers at the updated frequency.

The subject invention, however, in other embodiments, need not achieve all these objectives and the claims hereof should not be limited to structures or methods capable of achieving these objectives.

This invention features a fractional-N synthesizer system including a plurality of fractional-N synthesizers all updated simultaneously i.e. within the same reference period to generate an output frequency from the same reference frequency, a phase locked loop having an output signal whose frequency is a fractional multiple of the input reference frequency; the phase locked loop including a frequency divider, an interpolator responsive to an input fraction to provide to the frequency divider an output which has a fractional value equal to on average, the input fraction; and a timeout circuit responsive to the reference frequency for generating an output a predetermined time after updating to initialize the interpolator in each synthesizer to the same start conditions for locking together the phase of the frequency outputs of all of the synthesizers at the updated frequency.

This invention also features a method of synchronizing the phase of the output frequency of a plurality of fractional-N synthesizers including updating each of the fractional-N synthesizers to generate simultaneously the same output frequency from the same reference frequency; and generating an output a predetermined time after updating the frequency to initialize the interpolator in each synthesizer to the same start condition for locking together the phase of the frequency outputs of all of the synthesizers at the updated frequency.

In a preferred embodiment the timeout circuit may generate an output that occurs an integer number or multiple of reference periods after the reference period within which the synthesizers are updated. The timeout circuit may include a counter. The synthesizers may be updated by programming a new value of F or N. The phase locked loop may include a phase detector. The reference frequency may be the reference frequency of the phase detector or a function of the phase detector reference frequency and the input reference frequency.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
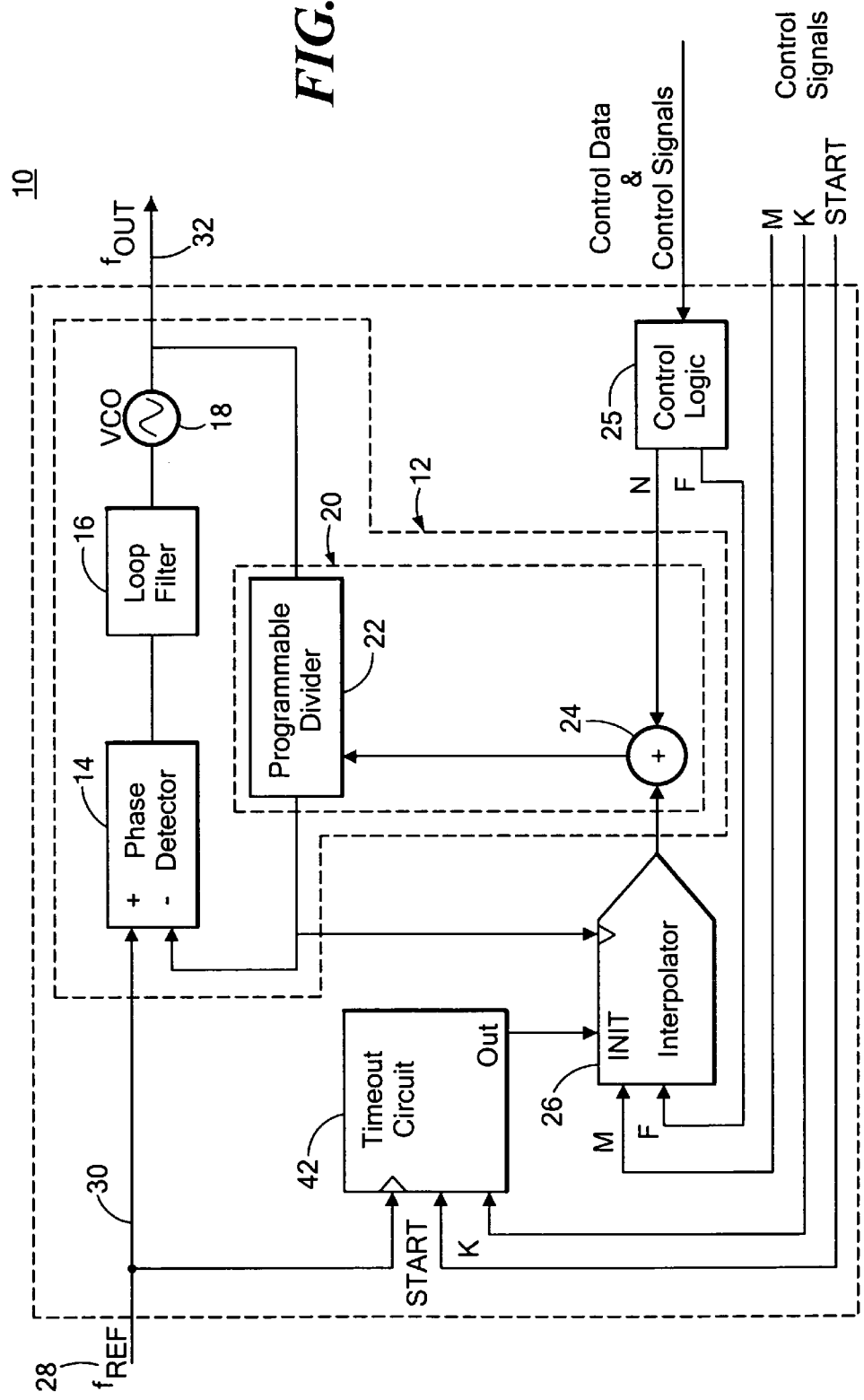
FIG. 1 is a schematic block diagram of a simple fractional-N synthesizer for a part of a fractional-N synthesizer system according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a fractional-N synthesizer 10 which is one of a plurality of such synthesizers forming a fractional-N synthesizer system according to this invention. Synthesizer 10 includes a phase locked loop (PLL) 12 including a phase detector 14, loop filter 16, voltage controlled oscillator (VCO) 18, and a frequency divider 20 which includes in FIG. 1, a programmable divider 22 and summing circuit 24. Interpolator 26 provides to summing circuit 24 the fractional input F/M where F is typically the numerator of the fraction and M is the denominator or modulus. The integer portion N can be provided from an external source; the two are combined in summing circuit 24 to provide the divisor number to programmable divider 22. The synthesizers may be updated by programming a new value of F or N by control logic 25 which may receive control data and control signals from external sources.

In operation a reference frequency 28 ($f_{REF}$) is delivered at input 30 to the positive input of phase detector 14. Voltage controlled oscillator 18 provides an output signal $f_{OUT}$ on line 32, the frequency of which is a function of the voltage supplied to VCO 18. The frequency of the output signal on line 32 is divided by the divisor in programmable divider 22 and delivered back to the negative input of phase detector 14. Any difference in the phase of the two signals is detected by phase detector 14 and a signal representative thereof is provided to loop filter 16. Loop filter 16 integrates or averages the signal and provides a voltage to VCO 18 to increase or decrease the frequency of the output signal four on line 32 until the inputs to phase detector 14 are balanced. The phase locked loop typically includes a phase detector and the reference frequency of the phase detector may be used as the reference frequency for the circuit. The reference frequency may be a function of the phase detector reference frequency and the input reference frequency e.g. the phase detector reference frequency may be divided by the input reference frequency.

Each time phase locked loop 12 is switched to a different channel, that is, the frequency of its output, $f_{OUT}$, is changed by changing any one or more of the parameters F, M, N, the balancing process starts anew.

If the multiple synthesizer application does not necessarily need phase synchronization to the reference, that is, it just requires the outputs to be phase synchronized to each other, then the implementation shown in FIG. 1 is applicable. The output frequency is programmed to a multiple of the reference frequency by programming the integer N and fractional parts F and M of the feedback division as in the prior art. The fractional modulus may be fixed by the capacity of the interpolator or it could be programmable, as in the example of the prior art, as disclosed and explained in more detail in U.S. Pat. No. 6,556,086, entitled FRACTIONAL-N SYNTHESIZER AND METHOD OF SYNCHRONIZATION OF THE OUTPUT PHASE, by Keaveney et al. dated Apr. 29, 2003 incorporated herein in its entirety by this reference. The synthesizer may be operated by control signals from a control interface, for example an SPI interface.

In accordance with this invention fractional-N synthesizer 10 includes timeout circuit 42 which, for example, may be a timeout counter. Timeout circuit 42 may generate an output that occurs an integer number or multiple of reference periods after the reference period within which the synthesizers are updated. Timeout circuit 42 receives one input from $f_{ref}$ 28. It also receives a start and a K or timeout input with a control signals. Interpolator 26 receives control signals M and F, while control signal N is delivered to summing circuit 24. Timeout circuit or counter 42 is clocked off the reference frequency 28 and starts counting when a new frequency is programmed. That is, whenever any one of N, M, or F are changed indicating an update in the frequency either to a new frequency or to a previous frequency, a start signal is applied to timeout circuit 42. The K or timeout signal is also provided to timeout circuit 42 or it may be hardwired or programmed into timeout circuit 42. Upon the timing out of timeout circuit 42 the signal is providing through the initializing input INIT of interpolator 26. Initializing interpolator 26 involves resetting some or all of its internal resistors to a known state. Depending on the interpolator implementation it may be just necessary to reset the contents of the first accumulator or integrator as well known in the prior art. The timeout counter value K sets the number of reference cycles before the INIT signal occurs after a new frequency is programmed. This should be set to a time interval that is at least as long as the time it takes the slowest phase detector to finally reach its linear region of operation and thus cause no more cycle slips during the PLL settling transient. Once counter 42 times out it stops counting until it is started again: for example, when a new frequency is programmed. This results in lower power consumption and low digital switching noise since the counter is not operating all the time.

Figure 2:
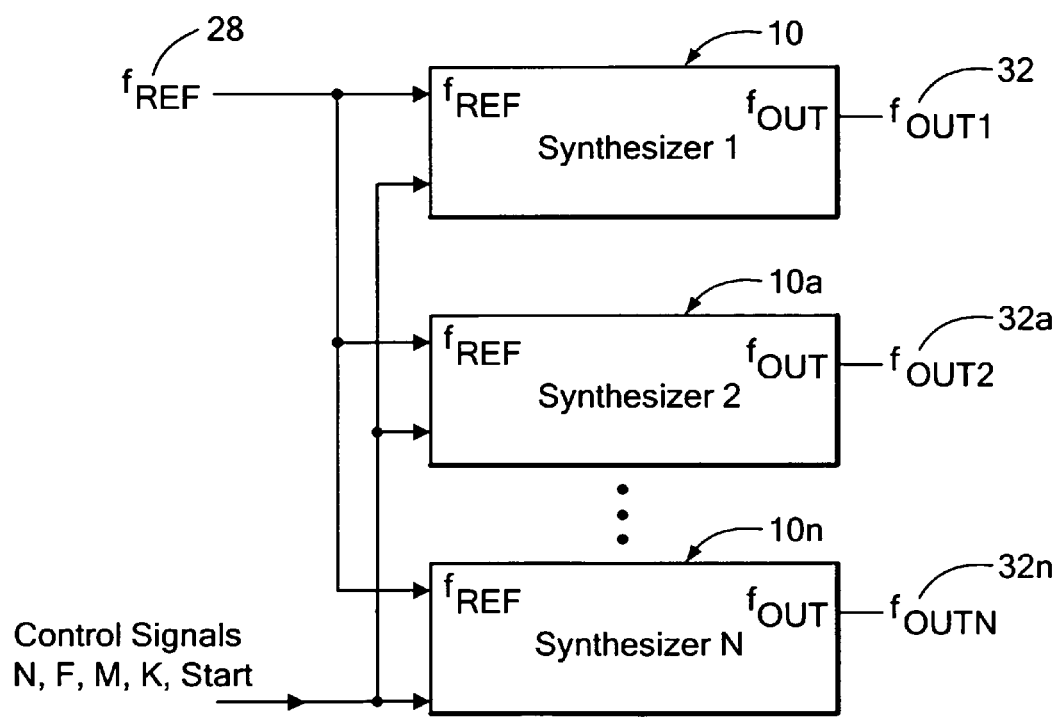
FIG. 2 is a schematic block diagram of a fractional-N synthesizer system according to this invention.

In accordance with this invention a number of such synthesizers 10, 10a, . . . 10n, FIG. 2 may be operated off a single input reference 28 to provide the same output frequencies at outputs 32, 32a, . . . 32n. All of the synthesizers 10-10n are operated by the same control signals N, F, M, K, and Start. Occasionally the synthesizers may produce different output frequencies and thus would have been programmed with different values of N, F or M.

Figure 3:
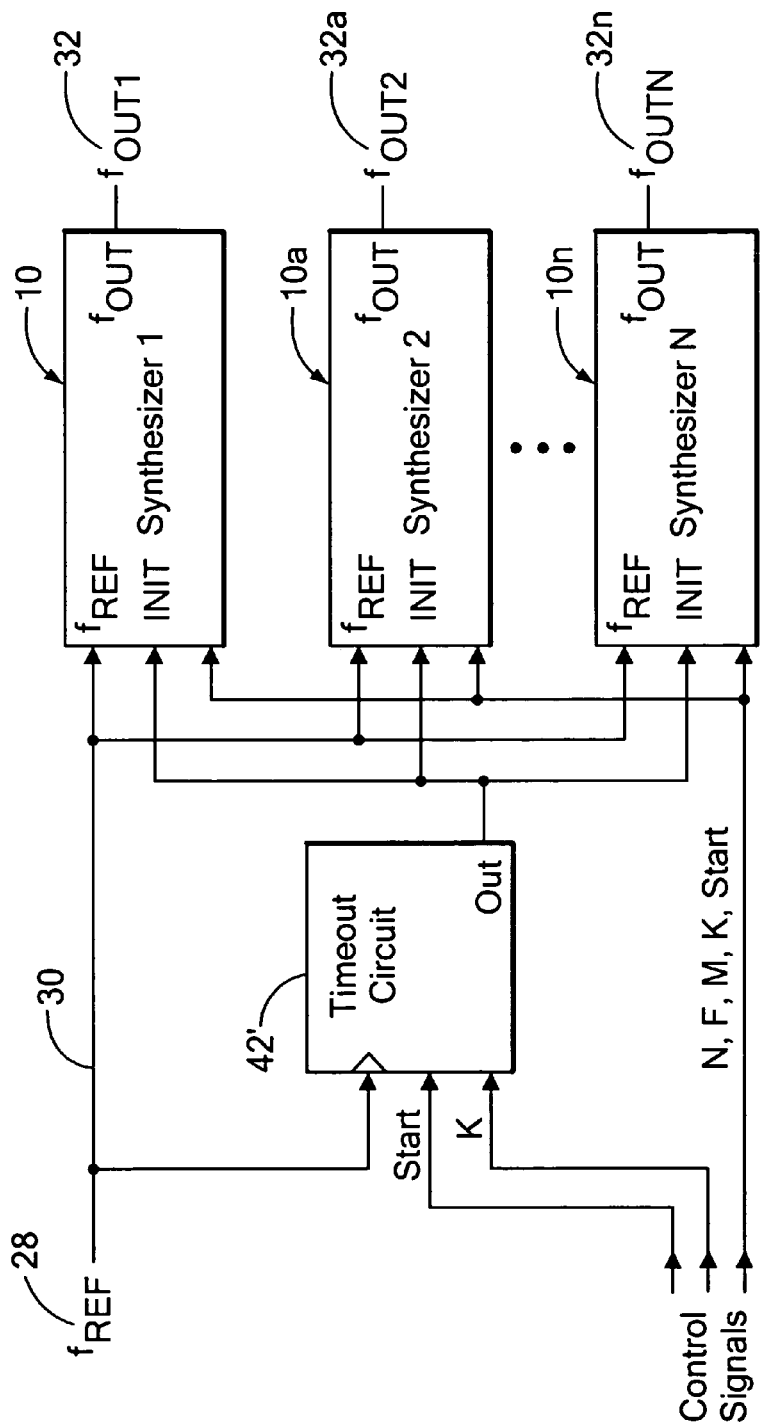
FIG. 3 is a schematic block diagram similar to FIG. 2 using a common timeout circuit for all fractional-N synthesizers.

Alternatively, since the timeout time K has to accommodate all of the synthesizers in the synthesizer system and since they are all producing the same frequency at their outputs 32, 32a, . . . 32n, FIG. 3, a single timeout circuit 42' may be used to service all of the synthesizers 10, 10a, . . . 10n.

Figure 4:
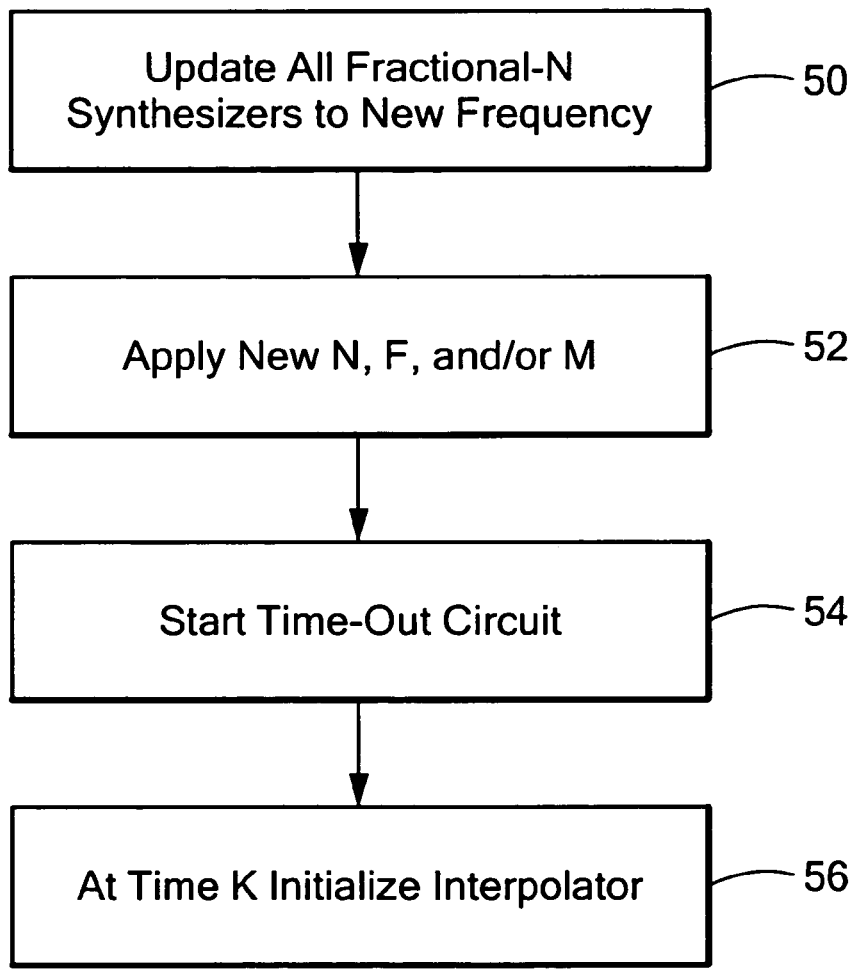
FIG. 4 is a block diagram of the method of this invention.

In accordance with the method of this invention all fractional-n synthesizers in the synthesizer system are updated simultaneously, within the same reference period, to a new frequency 50, FIG. 4, and a new divider value is applied by applying, 52, a new N, F, or M to program divider 22. The timeout circuit 42 is now actuated, 54, with a start signal delivered to the timeout circuit 42. Timeout circuit 42 now begins to count and at time K, 56, provides an initializing signal to interpolator 26 so that each of the interpolators 26 in each of the synthesizers 10-10n are synchronized at the same time.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A fractional-N synthesizer system comprising:
   a plurality of fractional-N synthesizers all updated within the same reference period to generate an output frequency from the same reference frequency each including; a phase locked loop having an output signal whose frequency is a fractional multiple of an in put reference frequency; said phase locked loop including a frequency divider; an interpolator responsive to an input fraction to provide to said frequency divider an output which has a fractional value equal to, on average, said input fraction; and
   a timeout circuit responsive to the reference frequency for generating an output a predetermined time after updating to initialize said interpolator in each synthesizer to the same start conditions for locking together the phase of the frequency outputs of all of said synthesizers at an updated frequency.

2. The fractional-N synthesizer system of claim 1 in which said timeout circuit generates an output that occurs an integer number of reference periods after the reference period within which the synthesizers were updated.

3. The fractional-N synthesizer system of claim 2 in which said timeout circuit includes a counter.

4. The fractional-N synthesizer system of claim 1 in which said synthesizers are updated by programming a new value for F and/or N.

5. The fractional-N synthesizer system of claim 1 in which said phase locked loop includes a phase detector.

6. The fractional-N synthesizer system of claim 5 in which said reference frequency is the reference frequency of the phase detector.

7. The fractional-N synthesizer system of claim 6 in which said reference frequency is a function of the reference frequency of the phase detector and the input reference.

8. A method of synchronizing the phase of the output frequency of a plurality of fractional-N synthesizers comprising;
   updating each of said fractional-N synthesizers to generate simultaneously the same output frequency from the same reference frequency; and
   generating an output a predetermined time after updating the frequency to initialize the interpolator in each synthesizer to the same start condition for locking together the phase of the frequency outputs of all of the synthesizers at an updated frequency.

* * * * *